United States Patent
Martter et al.

(10) Patent No.: US 6,856,157 B2
(45) Date of Patent: Feb. 15, 2005

(54) METHOD AND DEVICE FOR TESTING ELECTRONIC DEVICES

(75) Inventors: Robert H. Martter, Erie, PA (US); Craig C. Sundberg, Erie, PA (US); Richard N. Giardina, Erie, PA (US); Brian S. Fetscher, Girard, PA (US); G. James Deutschlander, Erie, PA (US)

(73) Assignee: Heatron, Inc., Leavenworth, KS (US)

( * ) Notice: Subject to any disclaimer, the term of this patent is extended or adjusted under 35 U.S.C. 154(b) by 0 days.

(21) Appl. No.: 10/794,017

(22) Filed: Mar. 5, 2004

(65) Prior Publication Data

US 2004/0169522 A1 Sep. 2, 2004

Related U.S. Application Data

(62) Division of application No. 10/175,522, filed on Jun. 19, 2002, now Pat. No. 6,720,784.
(60) Provisional application No. 60/299,632, filed on Jun. 20, 2001.

(51) Int. Cl.[7] .............................................. G01R 31/02
(52) U.S. Cl. ...................................... 324/760; 324/765
(58) Field of Search ................................ 324/755, 765, 324/760; 29/830, 842, 843; 174/257, 260, 256, 258; 361/260, 793

(56) References Cited

U.S. PATENT DOCUMENTS

| | | | |
|---|---|---|---|
| 3,408,565 A | 10/1968 | Frick et al. | |
| 3,979,671 A | 9/1976 | Meeker et al. | |
| 4,374,317 A | 2/1983 | Bradshaw | |
| 4,568,277 A | 2/1986 | MacInnes et al. | |
| 4,683,424 A | 7/1987 | Cutright et al. | |
| 4,777,434 A | 10/1988 | Miller et al. | |
| 5,073,814 A | 12/1991 | Cole, Jr. et al. | |
| 5,126,656 A | 6/1992 | Jones | |
| 5,329,093 A | 7/1994 | Okano | |
| 5,554,965 A | 9/1996 | Sundberg | |
| 5,555,422 A | 9/1996 | Nakano | |
| 5,659,245 A | 8/1997 | Ping et al. | |
| 5,946,546 A | 8/1999 | Fillion et al. | |
| 6,027,354 A | 2/2000 | Bowers et al. | |
| 6,097,200 A | 8/2000 | Turlapaty et al. | |
| 6,137,072 A | 10/2000 | Martter et al. | |
| 6,195,881 B1 | 3/2001 | Giardina et al. | |

FOREIGN PATENT DOCUMENTS

WO        WO 03/001859 A1        1/2003

*Primary Examiner*—Vinh P. Nguyen
(74) *Attorney, Agent, or Firm*—Rankin, Hill, Porter & Clark LLP

(57) ABSTRACT

The present invention provides a new electronic circuit board and a method of using such board to test electronic devices at elevated temperatures. The board comprises a steel base having a dielectric coating layer and a circuit formed on the layer. The circuit includes a connector region for attachment to an external electrical source and a mounting region for mounting sockets for supporting, powering and monitoring the electronic devices during elevated temperature testing. The board displays a leakage current of less than 10 $\mu$Amps at 350° C.

11 Claims, 2 Drawing Sheets

METHOD AND DEVICE FOR TESTING ELECTRONIC DEVICES

RELATED APPLICATIONS

This application claims the benefit of provisional application No. 60/299,632 filed Jun. 20, 2001 and application Ser. No. 10/175,522 filed Jun. 19, 2002, (now U.S. Pat. No. 6,720,784), both of which are incorporated herein by reference.

FIELD OF THE INVENTION

The present invention concerns an electronic circuit board for use in the high temperature testing of electronic devices and a method for conducting such tests. Such boards are commonly referred to as burn-in boards. The circuit board of the present invention comprises a base made of steel which is coated with a dielectric layer.

BACKGROUND OF THE INVENTION

The high temperature testing of electronic circuit devices is commonly employed in the semiconductor or microelectronic device manufacturing industries. Such tests are utilized in the burn-in, TDDB (time dependent dielectric breakdown) and the electromigration testing of semiconductor devices or chips.

Burn-in testing comprises the application of thermal and electrical stresses for the purposes of inducing the failure of marginal microelectronic devices having inherent defects resulting from manufacturing aberrations which cause time and stress dependent failures. TDDB testing concerns monitoring a device for diminished electric properties during heating. Electromigration in thin metal lines can cause chip failures with the formation of voids, or gaps, in interconnects. The potential for electromigration failures is a more significant issue in standard aluminum metal interconnects as chip makers attempt to reduce resistance using thinner wires. Copper metal interconnects are more resistant to electromigration. However, migration is still a concern and this concern has resulted in the need for testing procedures at elevated temperatures. These various elevated temperature tests are run both for the end-run qualification of chips and also for chip developmental purposes. These tests can also be run as a quality control test for incoming electronic devices or chips.

During all elevated temperature testing procedures, the electronic devices are loaded into sockets which make temporary electrical contact with the device leads. The sockets are mounted on high temperature circuit boards with circuitry to provide the proper voltages and electric stimuli to the devices. These circuit boards, which are used in electromigration, TDDB and burn-in testing, are commonly referred to as "burn-in boards." Once the boards are filled with devices, the boards are then loaded into a heating device, such as a convection oven, which in addition to supplying heat also provides an electrical interconnect between the boards and the power supplies and signal generators used to power the electronic devices during heating. During heating, the electrical characteristics of the electronic devices are continually monitored, logged and made available for analysis. The oven, power supplies and signal generators are commonly referred to as the burn-in system.

In the prior art, many burn-in boards were constructed of phenolic/epoxy materials. However, such boards present a major drawback. Specifically, such boards degrade quickly at elevated temperatures (e.g., temperatures in excess of about 180° C.). Ceramic substrates are employed for tests run at elevated temperatures (e.g., 300° C.), however, ceramic substrates are costly and they must be limited in size, for they are somewhat fragile. Boards comprising porcelain enamel coated steel substrates have also been used in the prior art to produce burn-in boards. These boards have been sold by the ECA Electronics Company of Erie, Pa., under the trademark ELPOR. However, such boards display a leakage current of about 40 µAmps or more at 350° C. For the testing of current generation electronic devices, there is a need for boards that display a leakage current of less than about 10 µAmps. Accordingly, there is a need for a robust high-temperature burn-in board which displays excellent electrical properties that can be produced at a reasonable cost.

SUMMARY OF THE INVENTION

The present invention provides a new and improved electronic circuit board or burn-in board for use in testing semiconductor chips or other electronic devices at elevated temperature and a method for conducting such tests. The burn-in board is extremely robust and it can be produced at a reasonable cost. Such boards display a leakage current of less than 10 µAmps at 350° C. Of course, leakage current is a function of board geometry, circuit area and operating temperature. However, burn-in boards generally display a surface area of 70 or more square inches per side, with about 10%–20% of each side printed with circuitry.

In one preferred embodiment the burn-in board comprises a stainless steel base having a dielectric coating formed thereon. The dielectric coating comprises multiple discrete layers of dielectric material. Formed on the dielectric coating is an electrical circuit. The circuit includes a connector region for facilitating attachment to an external electrical source and a mounting region for mounting sockets for supporting and supplying current to the electronic devices during heating. The board displays a leakage current of less than 10 µAmps at 350° C.

Among those benefits and improvements that have been disclosed, other objects and advantages of this invention will become apparent from the following description taken in conjunction with the accompanying drawings. The drawings constitute a part of this specification and include exemplary embodiments of the present invention and illustrate various objects and features thereof.

DETAILED DESCRIPTION

Figure 1:
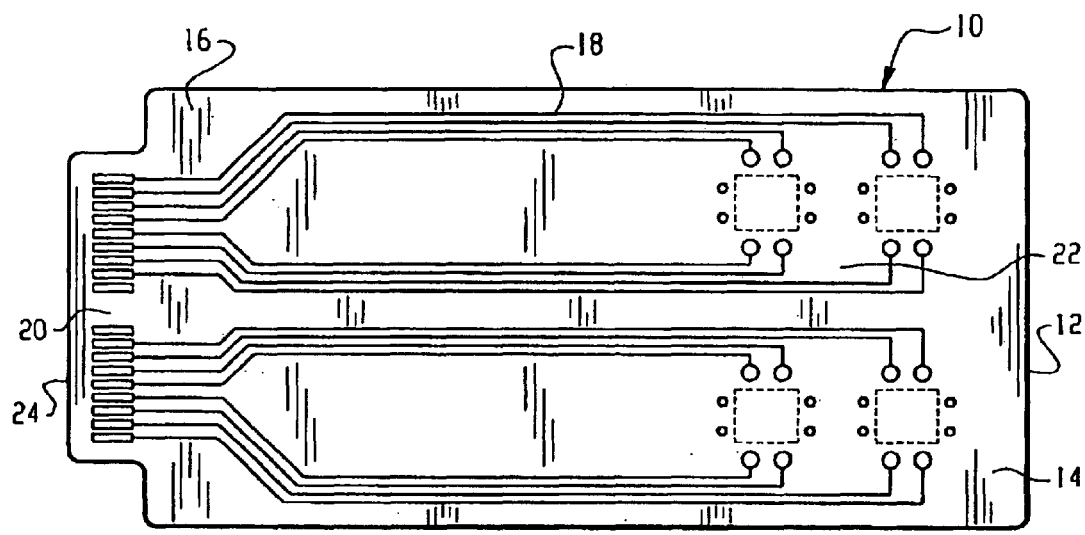
FIG. 1 is a top view of a burn-in board made in accordance with the present invention having no sockets mounted thereon.
Figure 2:
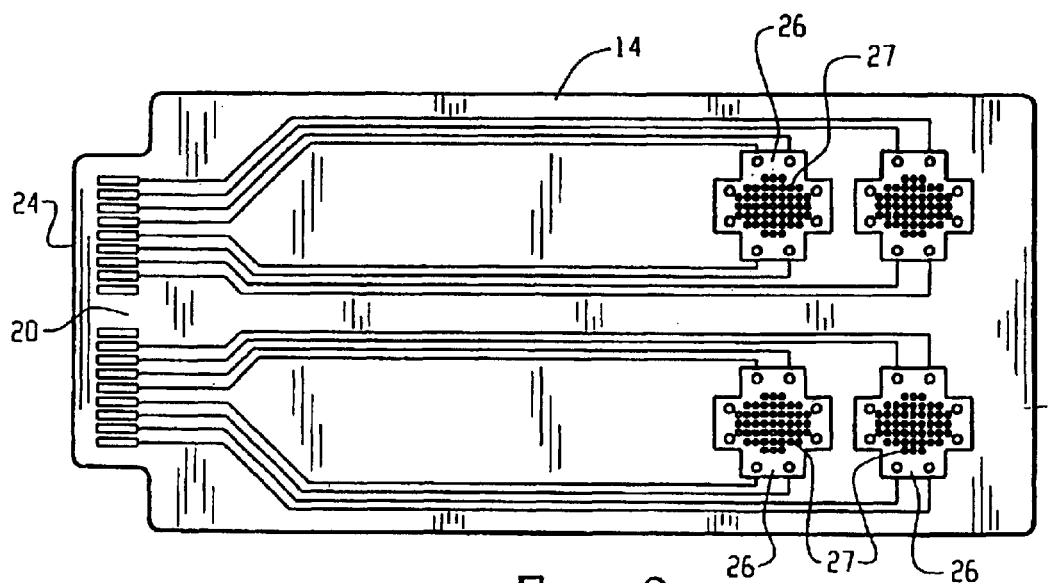
FIG. 2 is a top view of the burn-in board of FIG. 1 with sockets mounted thereon.
Figure 3:
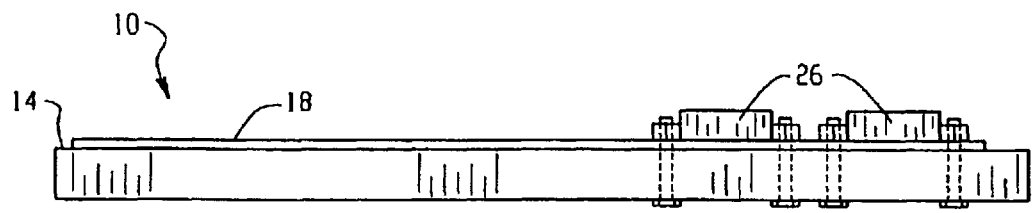
FIG. 3 is a schematic side view of the burn-in board of FIG. 2.

Referring to the drawings, and initially to FIGS. 1–3, there is illustrated a burn-in board or electronic circuit board 10 made in accordance with the present invention. In all of the drawings, the same reference numerals are used to identify similar elements. Board 10 comprises a metal base 12 coated along its top and bottom surfaces with a dielectric coating 14. The dielectric coating 14 in one embodiment comprises two (2) discrete layers of porcelain enamel. As discussed below, the dielectric coating 14 may be formed in a variety of manners.

Board 10 includes along its top surface 16 an electrical circuit 18 formed by use of a thick film conductor material. Circuit 18 includes a connector region 20 and a mounting region 22. The front end 24 of connector region 20 is where the board is plugged into an electrical receptacle located in the heating device or oven wherein the board 10 is intended to be utilized. The mounting region 22 is the portion of the board wherein the sockets 26 for supporting the electronic devices 27 that are being tested are located. Sockets 26 may comprise one of a variety of commercially available sockets for supporting electronic devices, such as, semiconductor chips, for testing. In addition to providing mounting support, sockets 26, provide an electrical connection between the circuit 18 and the devices 27.

Figure 4:
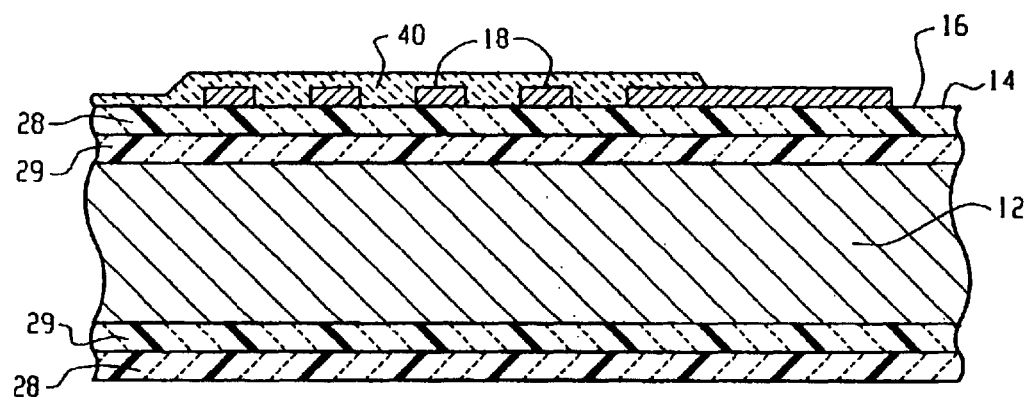
FIG. 4 is a schematic broken-away cross-sectional view of a portion of a burn-in board made in accordance with the present invention.

Referring now to FIG. 4, there is schematically illustrated a broken-away cross-sectional view of a burn-in board 10 made in accordance with the present invention. As shown, board 10 includes the metal base 12, and the dielectric coating or material layer 14. On top surface 16 of dielectric layer 14 is the electronic circuit or circuit trace 18.

As illustrated, dielectric layer 14 is formed from two discrete layers 28 and 29 of dielectric material. Layers 28 and 29 are formed from different material systems, and thus they are nonhomogeneous. Base or substrate 12 may comprise any one of a variety of high temperature firing metal materials. Examples of such materials include decarburized steel or stainless steel and it will be appreciated that the base may be coated on all sides or just one side depending upon circuit requirements. Metal substrates coated with a dielectric layer of electronic grade porcelain enamel along all sides of the metal base are commercially available under the trade designation ELPOR from the ECA Electronics Company located in Erie, Pa. Coated substrates are commercially available from ECA Electronics made with either low carbon steel or various grades of stainless steel. Applicants hereby incorporate by reference U.S. Pat. No. 6,195,881B1; Lim et al., U.S. Pat. No. 5,002,903; Ohmura et al., U.S. Pat. No. 4,361,654; Kaup et al., U.S. Pat. No. 3,935,088; Moritsu et al., U.S. Pat. No. 4,172,733; Van derVliet, U.S. Pat. No. 4,085,021; Hang et al., U.S. Pat. No. 4,256,796; Andrus et al., U.S. Pat. No. 4,358,541; Chyung, U.S. Pat. No. 4,385,127; Gazo et al. U.S. Pat. No. 3,841,986 and Hughes U.S. Pat. No. 3,575,838 for their teachings as to how to produce metal substrates coated with a dielectric layer.

For certain test applications, a test board may be required that provides a maximum leakage current of 10 $\mu$Amps at 350° C. In such applications, a dielectric coating 14 formed from multiple dielectric layers 28 and 29 of nonhomogeneous materials is required. Such multilayer boards may be formed by taking a porcelain enamel metal coated substrate available from ECA Electronics Company under the trade designation ELPOR and coating it with a high performance electronic grade porcelain enamel coating material available from the Ferro Corporation of Cleveland, Ohio, under the trade designation QP-330. The ECA substrate with its enamel coating provides bottom dielectric layer 29 and the QP-330 material provides top layer 28. QP-330 is applied wet to the ECA porcelain coated substrates and then fired at about 800° C. The QP-330 material may either be applied by dipping or screen printing to a thickness of about 0.002" (after firing). One to three layers of the QP-330 material maybe applied successfully to the ECA porcelain coated substrates. Applicants have found that the use of multiple layers of the QP-330 leads to improved breakdown current properties.

As shown in FIG. 4, an encapsulant layer 40 may be applied over the conductive circuit 10 to add further protection. A suitable encapsulant layer may be formed using a glass encapsulant sold by the Ferro Corporation of Cleveland, Ohio, under the trade designation A-3565. The glass encapsulant serves to prevent particulate migration between individual circuit traces. The encapsulant may be applied, for example, by screen printing directly on the thick film materials and the top surface of the dielectric layer and then the entire board may be fired at a temperature of about 625° C.

Test boards that display further improved electrical properties may also be produced by forming a dielectric coating using multiple discrete homogeneous layers of commercially available thick film dielectric materials intended for use on metal substrates. Such boards display a maximum leakage current of 1 $\mu$Amp at 350° C. Examples of such materials include a thick film material available from Electro-Science Laboratories, Inc. of King of Prussia, Pa., under the trade designation 4924, thick film materials available from DuPont of Wilmington, Del., under the trade designation 3500N and thick film materials available from Heraeus of West Conshohocken, Pa., under the trade designation IP-222. These commercially available materials are preferably applied to 430 stainless steel. These materials are intended for use in making thick film heaters, but applicants have unexpectedly found them suitable for use in the present invention.

Figure 5:
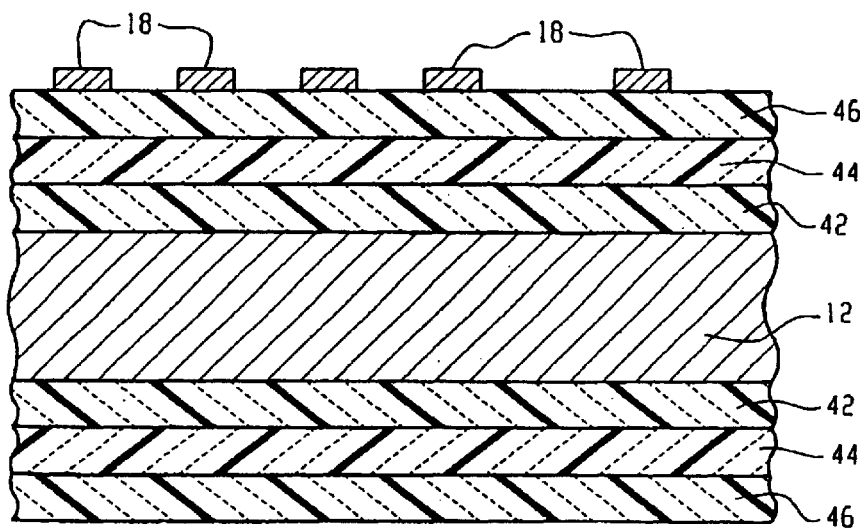
FIG. 5 is a schematic broken-away cross-sectional view of a portion of another embodiment of a burn-in board made in accordance with the present invention.

The thick film dielectric materials are applied in multiple layers upon the metal substrate and then they are fired at a temperature of about 850° C. Prior to application of the dielectric materials the stainless steel surface is thoroughly cleaned. The layers are preferably applied by screen printing. However, other application techniques such as spraying could be utilized. Each applied layer is dried prior to application of the subsequent layer. Referring to FIG. 5 there is illustrated a substrate 12 having multiple layers of dielectric material 42, 44, 46 screen printed upon substrate 12. Burn-in boards made using three layers of the 4924 thick film material at a total thickness after firing per side of about 0.006" display a maximum leakage current of 1 $\mu$Amps at 350° C.

Electrical circuit 18 may be formed in a conventional manner using a suitable commercially available conductive thick film or combination of commercially available thick films. The thick films are applied to the top of the dielectric layer using conventional application techniques, such as, for example, screen printing. Examples of other possible, but generally less desirable application techniques other than screen printing include, for example, spraying, dipping, spinning, brushing and application using a doctor blade. An example of a suitable thick film for use in the present invention is a gold thick film available from Electro-Science Laboratories, Inc. under the trade designation 8835. It will be appreciated that a multilayer circuit structure may be formed by applying a dielectric thick film layer over the conductive layer. After firing the dielectric layer may form as a base for printing an additional circuit using conductive thick film materials.

The circuit boards 10 of the present invention allow for a method of high temperature testing of electronic devices such as, semiconductor chips, at elevated temperatures, such as from about 350° C. to about 500° C., or preferably from about 400° C. to about 500° C. During testing, while at elevated temperature, controlled electric current or signals are supplied to the devices under test, and the performance properties of such devices are tracked.

Although the invention has been shown and described with respect to preferred embodiments, it is obvious that equivalent alterations and modifications will occur to others skilled in the art upon reading and understanding the specification. The present invention includes all such equivalent alterations and modifications, and is limited only by the scope of the following claims.

What is claimed is:

1. A method of conducting the high temperature testing of an electronic device comprising the steps of:
   (i) providing an electronic circuit board for supporting and supplying current to the device to be tested, said electronic circuit board comprising a steel base coated with a dielectric material coating;
   (ii) providing electric current to the electronic circuit board; and
   (iii) heating the electronic circuit board to a temperature of from about 350° C. to about 500° C.

2. A method as set forth in claim 1 wherein said steel base comprises stainless steel.

3. A method as set forth in claim 1 wherein said electronic circuit board includes a connector region for attachment to an external electrical source and a mounting region having sockets for supporting said electronic device.

4. A method as set forth in claim 1 including the step (iv) of monitoring the electrical characteristics of said electronic device during heating.

5. A method as set forth in claim 1 wherein said dielectric material coating comprises multiple discrete layers of dielectric material, and said electronic circuit board displays a leakage current of less than 10 $\mu$Amps at 350° C.

6. A method as set forth in claim 1 wherein said electronic circuit board displays a leakage current of less than 1 $\mu$Amps at 350° C.

7. A method as set forth in claim 1 wherein said dielectric material coating comprises a first layer of porcelain enamel and a second layer of high-performance porcelain enamel.

8. A method as set forth in claim 1 wherein said dielectric material coating comprises multiple discrete layers of dielectric material.

9. A method as set forth in claim 1 wherein said dielectric material coating comprises two discrete layers of dielectric material.

10. A method as set forth in claim 7 wherein said first and second layers of enamel are nonhomogeneous.

11. A method as set forth in claim 1 wherein said dielectric material coating comprises at least three discrete layers of dielectric material.

* * * * *